United States Patent
Ilic

(10) Patent No.: US 7,423,894 B2
(45) Date of Patent: Sep. 9, 2008

(54) INTERLEAVED SOFT SWITCHING BRIDGE POWER CONVERTER

(75) Inventor: Milan Ilic, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 194 days.

(21) Appl. No.: 11/367,905

(22) Filed: Mar. 3, 2006

(65) Prior Publication Data

US 2007/0211507 A1    Sep. 13, 2007

(51) Int. Cl.
*H02M 7/5387* (2007.01)
*H02M 3/24* (2006.01)

(52) U.S. Cl. .......................................... 363/132; 363/98

(58) Field of Classification Search ................ 363/16, 363/17, 21.03, 95, 97, 131, 132, 98; 323/235
See application file for complete search history.

(56) References Cited

U.S. PATENT DOCUMENTS

| | | | |
|---|---|---|---|
| 5,204,809 A | 4/1993 | Andresen | |
| 5,657,219 A | 8/1997 | Stanley | |
| 6,211,657 B1 * | 4/2001 | Goluszek | .................... 323/272 |
| 6,337,801 B2 | 1/2002 | Li et al. | |
| 6,750,633 B2 | 6/2004 | Schreiber | |
| 6,845,020 B2 | 1/2005 | Deng et al. | |
| 6,937,091 B2 | 8/2005 | Tanaka et al. | |
| 6,940,735 B2 | 9/2005 | Deng et al. | |
| 6,949,915 B2 | 9/2005 | Stanley | |
| 6,979,980 B1 | 12/2005 | Hesterman et al. | |
| 7,110,265 B2 * | 9/2006 | Liu et al. | ....................... 363/16 |
| 7,295,448 B2 * | 11/2007 | Zhu | ............................ 363/17 |

OTHER PUBLICATIONS

Milan Ilic and Dragan Maksiimovic, "Interleaved Zero Current Transition Buck Converter", Proceedings IEEE APEC 2005 vol. 2 pp. 1265-1271. Conference was from Mar. 6-Mar. 10, 2005, Austin, TX.

* cited by examiner

*Primary Examiner*—Matthew V Nguyen

(57) ABSTRACT

An interleaved soft switching bridge power converter comprises switching poles operated in an interleaved manner so as to substantially reduce turn-on switching losses and diode reverse-recovery losses in the switching pole elements. Switching poles are arranged into bridge circuits that are operated so as to provide a desired voltage, current and/or power waveform to a load. By reducing switching turn on and diode reverse recovery losses, soft switching power converters of the invention may operate efficiently at higher switching frequencies. Soft switching power converters of the invention are well suited to high power and high voltage applications such as plasma processing, active rectifiers, distributed generation, motor drive inverters and class D power amplifiers.

15 Claims, 11 Drawing Sheets

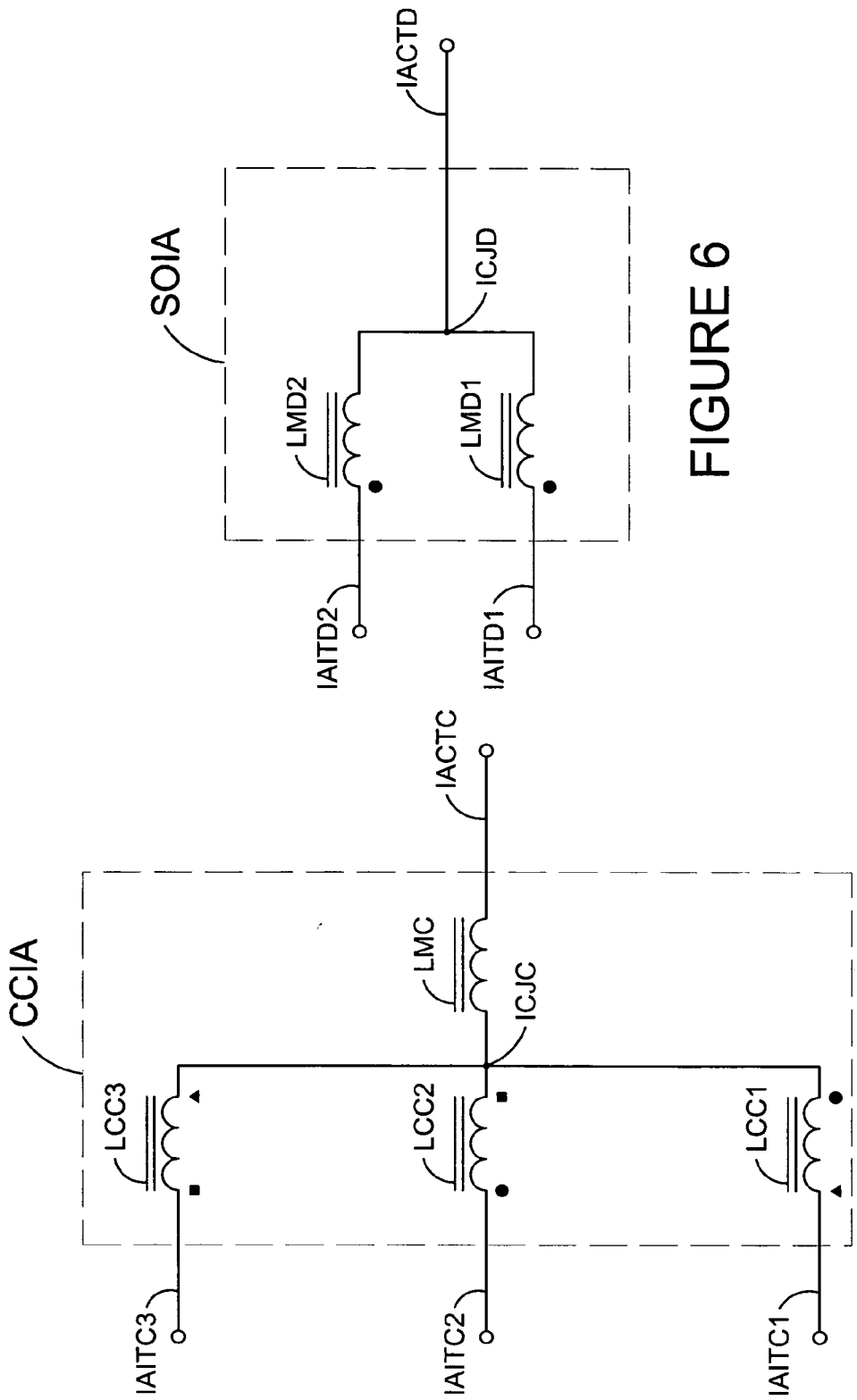

US 7,423,894 B2

INTERLEAVED SOFT SWITCHING BRIDGE POWER CONVERTER

BACKGROUND OF THE INVENTION

1. Field of the Invention

This invention relates generally to switch mode power converters, and more particularly, though not by way of limitation, to soft switching bridge power converters suitable for high power and high voltage DC-DC, AC-DC and DC-AC conversion.

2. Brief Description of the Prior Art

It is generally desirable to operate switching power supplies at the highest frequency that is practical for a particular circuit. Operating at higher frequencies allows inductor and capacitor values in a power supply to be reduced, which reduces physical size and cost and also enables improvements in the transient response of the power supply. Reducing the energy available for delivery to load arcing, such as plasma arcs, is also a desirable goal. High-frequency operation allows the use of smaller output filter capacitors, which store less energy than larger capacitors, and this reduces the energy that can be supplied to plasma arcs. Operating frequencies in switch mode power supplies that utilize hard-switching power converters are limited, however, because the switching losses can become prohibitively high as the operating frequency is increased.

AC-DC and DC-AC bridge power converters typically comprise sets of one or more simple pole circuits. In a hard-switched simple switching pole circuit, for example, a switching device is connected between positive pole and active pole terminals, and a second switching device is connected between the negative pole and active pole terminals. During operation of the pole circuit, the active pole terminal is alternately connected between the positive and negative pole terminals as the switches are turned alternately on and off. A full-bridge converter requires two pole circuits, and a half-bridge converter has only one pole circuit. Bridge converters configured for multiphase operation comprise multiple pole circuits; for example, a three-phase hard-switched bridge converter comprising three simple pole circuits with three active terminals. Depending on how the hard-switched bridge converter it is configured and utilized, power may flow into or out of the active terminals. Switching devices of switching bridge converters are typically realized with active switches (e.g. insulated gate bipolar transistors (IGBT), bipolar transistors, field-effect transistors) or with diodes functioning as passive switches. In hard-switched converter circuits, however, considerable losses may occur when an active switch in a simple pole circuit is turned on while a diode in the other switch of the pole circuit is conducting.

Various schemes have been designed to employ soft-switching inverter poles using auxiliary switches in order to avoid switching losses in power converters. In addition to requiring auxiliary switches, such soft-switching bridge schemes typically include resonant circuits that add additional cost and incur losses due to circulating currents.

Class D amplifier circuits use pole circuits to produce AC or DC voltages or currents that change at rates that are slow compared to the switching frequency. For example, class D audio amplifiers may employ a single hard-switched inverter pole with its active terminal coupled to a load through an LC lowpass filter. Alternatively a DC-DC converter may use two hard-switched inverter pole circuits with active terminals that are connected to coupled filter inductors. The poles circuits are switched in an interleaved manner that reduces ripple in the output current, but the circuit does not provide soft switching.

Like class D amplifiers, opposed-current converters produce AC or DC voltages or currents that change at rates that are slow compared to the switching frequency. These converters may use compound pole circuits that consist of a positive pole circuit and a negative pole circuit. The positive pole terminals are connected together and the negative pole terminals are connected together. An inductor is connected between the active pole terminal of each of the two inverter poles and a node which serves as the active pole terminal for the compound pole circuit. The active switches in the positive and negative pole circuits are both on at the same time, and so considerable current flows in these inductors even when there is no output current, resulting in low efficiencies.

SUMMARY OF THE INVENTION

This invention provides interleaved soft switching bridge power converters having interleaved soft switching poles. In general, a switching converter of the invention comprises one or more switching poles connected to a voltage source. The poles are operated in an interleaved manner so as to substantially reduce turn-on switching losses and diode reverse-recovery losses in the switching pole elements.

In one embodiment of the invention, a bridge power converter comprises at least one composite or compound switching pole having a positive pole terminal, a negative pole terminal and an active pole terminal. Each composite switching pole comprises a plurality of simple switching poles comprised of two switches connected in series and joined at an active terminal, with each switch being either active or passive. Passive switches comprise a diode and active switches include an anti-parallel diode. Each active terminal of each simple switching pole is connected to an input terminal of an inductor assembly. The active switches in a compound switching pole are operated in an interleaved manner so that the action of an active switch being turned on during a switch conduction interval causes a diode in another switch to be subsequently turned off during a commutation interval. The active pole terminal of each composite switching pole is connected to a common terminal of the inductor assembly.

In accordance with various embodiments of the invention, composite switching poles are arranged into bridge circuits, such as half-bridge, full bridge, or poly-phase bridges. The positive pole terminals are connected together to form a positive bridge terminal, and the negative pole terminals are connected together to form a negative bridge terminal. The switches in the composite switching pole are operated to control the flow of power through the bridge. Bridge converters of the invention are operated so as to provide a desired voltage, current and/or power waveform to a load.

By reducing switching turn on and diode reverse recovery losses, soft switching power converters of the invention may operate efficiently at higher switching frequencies. Soft switching power converters of the invention are well suited to high power and high voltage applications such as plasma processing, active rectifiers, distributed generation, motor drive inverters and class D power amplifiers.

BRIEF DESCRIPTION OF THE DRAWINGS

FIGS. 3-6 illustrate details of various embodiments of the inductor assembly IA of FIG. 2 that provide filtered current.

DETAILED DESCRIPTION

Figure 1:
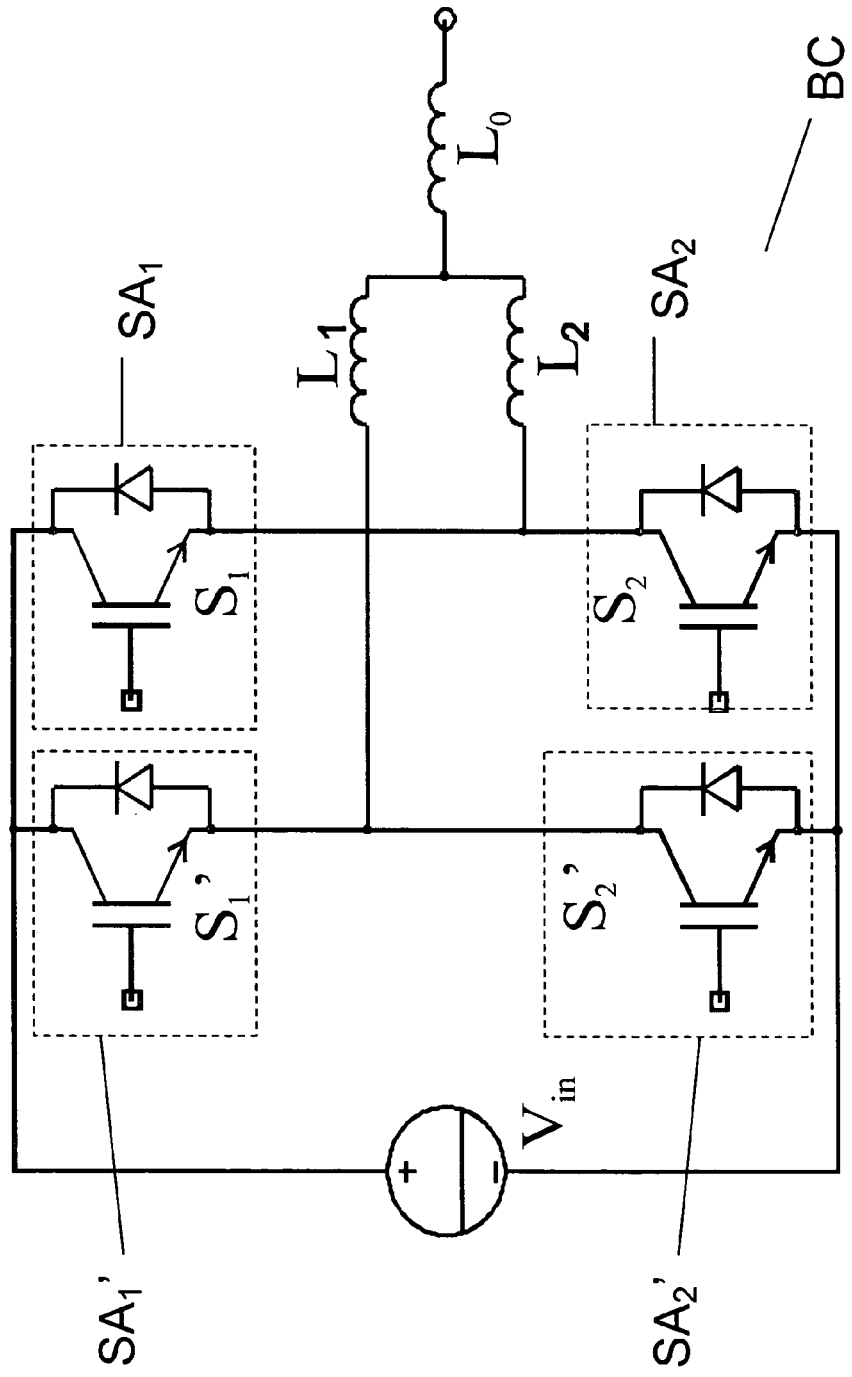
FIG. 1 illustrates an interleaved soft switching circuit in accordance with one embodiment of the invention.

FIG. 1 illustrates an interleaved soft switching circuit in accordance with one embodiment of the invention. Bridge converter circuit BC comprises switching pole circuits comprising switch assemblies $SA_1$, $SA_1'$, $SA_2$, and $SA_2'$. Each of switch assemblies $SA_1$, $SA_1'$, $SA_2$, and $SA_2'$ comprises a switching semiconductor switching device $S_1$, $S_1'$, $S_2$, and $S_2'$, respectively, disposed in parallel with an anti-parallel diode. Switches $S_1'$ and $S_2'$ and switches $S_1$ and $S_2$ form first and second pole circuits, respectively, disposed across positive and negative voltages supplied by voltage supply $V_{in}$. Control circuitry (not shown) is connected to the control terminals of switches $S_1$, $S_1'$, $S_2$, and $S_2'$ and delivers control pulses to control opening and closing of the switches. First pole circuit comprising switches $S_1'$ and $S_2'$ has an active pole terminal connected to inductor $L_1$, and second pole circuit comprising switches $S_1$ and $S_2$ has an active pole terminal connected to inductor $L_2$. The outputs of inductors $L_1$ and $L_2$ are connected to main inductor $L_0$. The output terminal of the bridge converter circuit (the output of inductor $L_0$) drives a load (not shown).

In a first switching cycle, switch $S_1'$ closes and positive current is conducted from voltage $V_{in}$ source through inductor $L_1$ and main inductor $L_0$ to the circuit load. Switch $S_1'$ opens at the end of the first switching cycle, at which point the inductor current is conducted during a second switching cycle through the anti-parallel diode of switch assembly $SA_2'$. Before switch $S_1'$ is again closed to continue delivery of positive load current, switch $S_1$ is closed during a third switching cycle. Current is conducted from voltage $V_{in}$ source through switch $S_1$, inductor $L_2$, and inductor $L_1$ so as to provide controlled current slope ($V_{in}/(L_1+L_2)$ which recovers the anti-parallel diode of switch assembly $SA_2'$ with significantly reduced losses. Also, as a result when switch $S_1'$ is again closed to continue delivery of positive load current, the amount of current conducted through $S_1'$ that would be experienced as reverse recovery current by anti-parallel diode of switch assembly $SA_2'$ is substantially reduced.

Similarly, when switch $S_1$ is opened, inductor current is conducted through the anti-parallel diode of switch assembly $SA_2$. When switch $S_1'$ is closed to continue delivery of positive load current, shut-off current with controlled slope ($V_{in}/(L_1+L_2)$) is also provided to the anti-parallel diode of switch assembly $SA_2$ through switch $S_1'$, inductor $L_1$, and inductor $L_2$. This in turn reduces the reverse recovery current experienced by anti-parallel diode of switch assembly $SA_2$. Also, when switch $S_1$ is again closed the reverse recovery loss of anti-parallel diode of switch assembly $SA_2$ is very low.

Control circuitry of bridge converter BC regulates the operation of switches $S_1$ and $S_1'$ in duration and phase so as to provide a desired positive current waveform to a load. Similarly, switches $S_2$ and $S_2'$ are operated so as to provide a desired negative current waveform to a load. In a first negative switching cycle, switch $S_2'$ closes and negative current is conducted from voltage $V_{in}$ source through inductor $L_1$ and main inductor $L_0$ to the circuit load. Switch $S_2'$ opens at the end of the first negative switching cycle, at which point the inductor current is conducted during a second switching cycle through the anti-parallel diode of switch assembly $SA_1'$. Before switch $S_2'$ is again closed to continue delivery of negative load current, switch $S_2$ is closed during a third switching cycle. Current is conducted from voltage $V_{in}$ source through switch $S_2$, inductor $L_2$, and inductor $L_1$ so as to provide shut-off current with controlled slope ($V_{in}/(L_1+L_2)$ to the anti-parallel diode of switch assembly $SA_1'$. Similarly, when switch $S_2$ is opened, inductor current is conducted through the anti-parallel diode of switch assembly $SA_1$. When switch $S_2'$ is closed to continue delivery of positive load current, shut-off current is also provided to the anti-parallel diode of switch assembly $SA_1$ through switch $S_2'$, inductor $L_1$, and inductor $L_2$.

Inductances $L_1$ and $L_2$ control the current slopes during switching transitions, thereby affecting the losses associated with diode reverse recovery currents. By choosing the values of $L_1$ and $L_2$, the amount of the residual diode current, and therefore any additional turn-on losses, can be controlled and minimized. Larger values of $L_1$ and $L_2$ generally result in smaller reverse recovery and residual currents, but the transition times are longer. Hence, values are chosen to optimize the trade-off between switching frequency, loss of duty cycle control range, and the total power loss of the converter.

Bridge converter BC is operated so as to provide a desired voltage, current and/or power waveform to a load. In one embodiment of the invention, a bridge converter operates to deliver low frequency AC power, for example at 60 Hz. In another embodiment of the invention, a bridge converter operates to deliver power at mid frequencies or radio frequencies, as for example to a plasma load.

In other embodiments of the invention, each of a plurality of bridge converters operates as an element of a multiphase power converter. In one embodiment, each of three bridge-type converters as depicted in FIG. 1 is disposed as one leg of a three-phase interleaved inverter. As described in connection with the embodiment of FIG. 1, switches of the bridge converters are operated and regulated in duration and phase so as to produce a three-phase voltage, current and/or power waveform at the output of the three-phase inverter at a desired output frequency.

Figure 2:
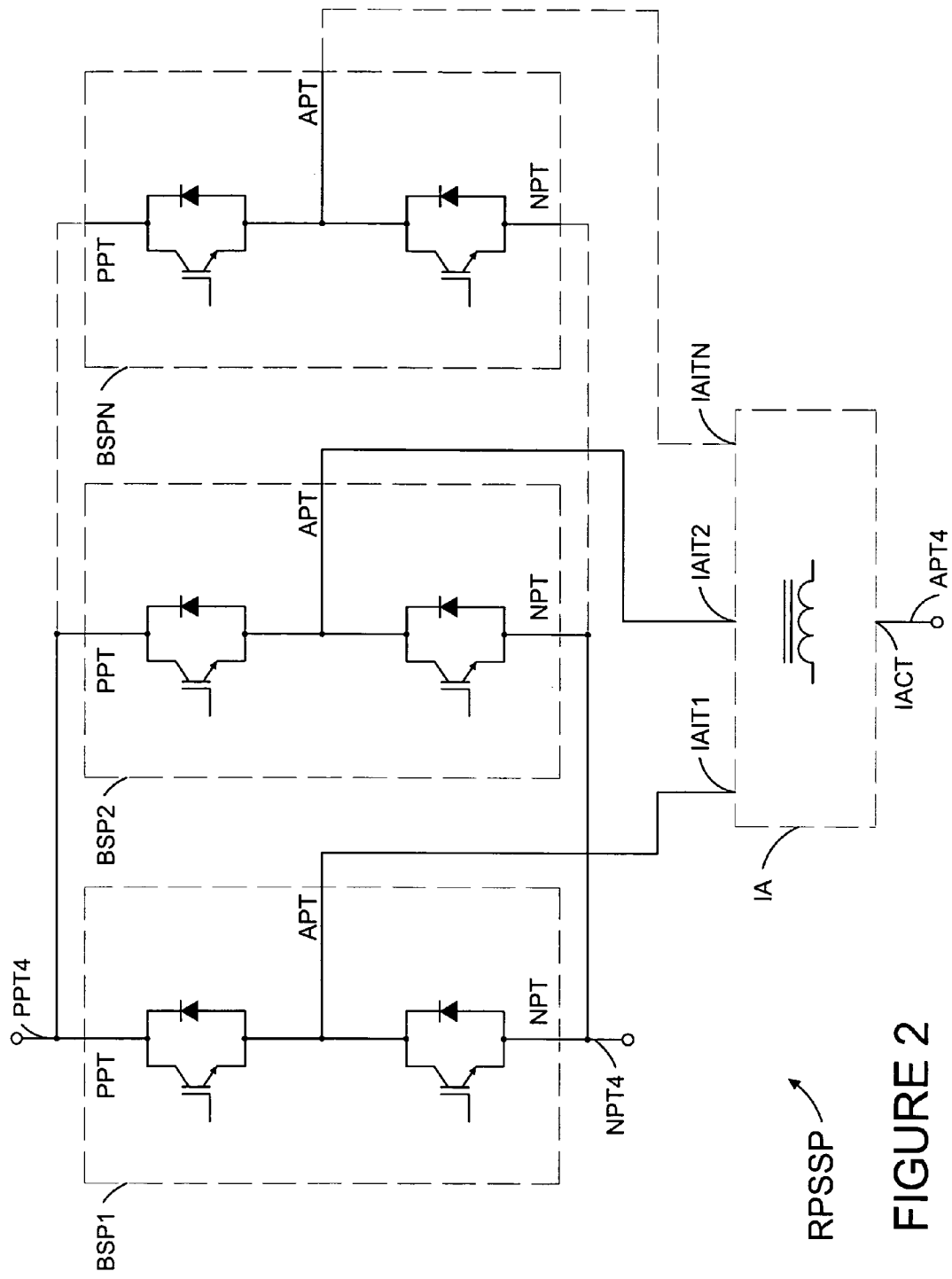
FIG. 2 illustrates a repetitive-polarity interleaved soft switching pole circuit in accordance with one embodiment of the invention.

FIG. 2 illustrates a repetitive polarity interleaved soft switching pole circuit RPSSP in accordance with one embodiment of the present invention. A composite pole circuit includes at least two bipolar simple switching pole circuits BSP1 and BSP2. Each bipolar simple switching pole circuit has a first active switch connected between a positive pole terminal PPT and an active pole terminal APT, and a second active switch connected between a negative pole terminal NPT and the active pole terminal.

Alternatively, additional pole circuits are connected, for a total of N bipolar pole circuits, as indicated by the dashed connections to the Nth bipolar pole circuit BSPN. The positive pole terminal PPT of each switching pole is connected to a positive pole terminal PPT4, and the negative pole terminal NPT of each switching pole is connected to a negative pole terminal NPT4. The active pole terminal APT of each bipolar pole circuit, BSP1 . . . BSPN is connected to an inductor assembly, IA, at an inductive assembly input terminal, IAIT1 . . . IAITN. An inductor assembly common terminal IACT is connected to the active pole terminal APT4 of repetitive polarity interleaved soft switching pole circuit RPSSP.

The embodiment of FIG. 2 allows use of multiple switches that can share processed power, while still having reduced switching losses. For example, if the total number of switches in a converter circuit is doubled, while the total power dissipation within the converter may remain the same, the dissipation from any one switch is reduced by half which may simplify cooling of the switches.

FIGS. 3-6 show alternative implementations of inductor assembly IA of FIG. 2 when filtering of the current flowing in the active pole terminal is required. The inductances between pairs of inductor assembly input terminals that are connected to a pair of consecutively operated switching pole circuits, $L_{ii}$, is an important parameter in producing soft switching operation. The inductance between an inductor assembly input terminal and the inductor assembly common terminal IACT, $L_{ic}$, influences the magnitude of the ripple current flowing through the active pole terminal of the soft switching pole circuit. Preferably, the $L_{ii}$ inductance values are less than one fifth of the inductance of $L_{ic}$.

The inductor assemblies of FIGS. 3-6 can be constructed so as to have the same inductances the between all corresponding pairs of their terminals. If the inductances between the terminal pairs are equivalent for various inductor assemblies, then the converter waveforms will also be equivalent for the same operating conditions, and the total energy stored in each inductor assembly will be the same.

Figures 3, 4:
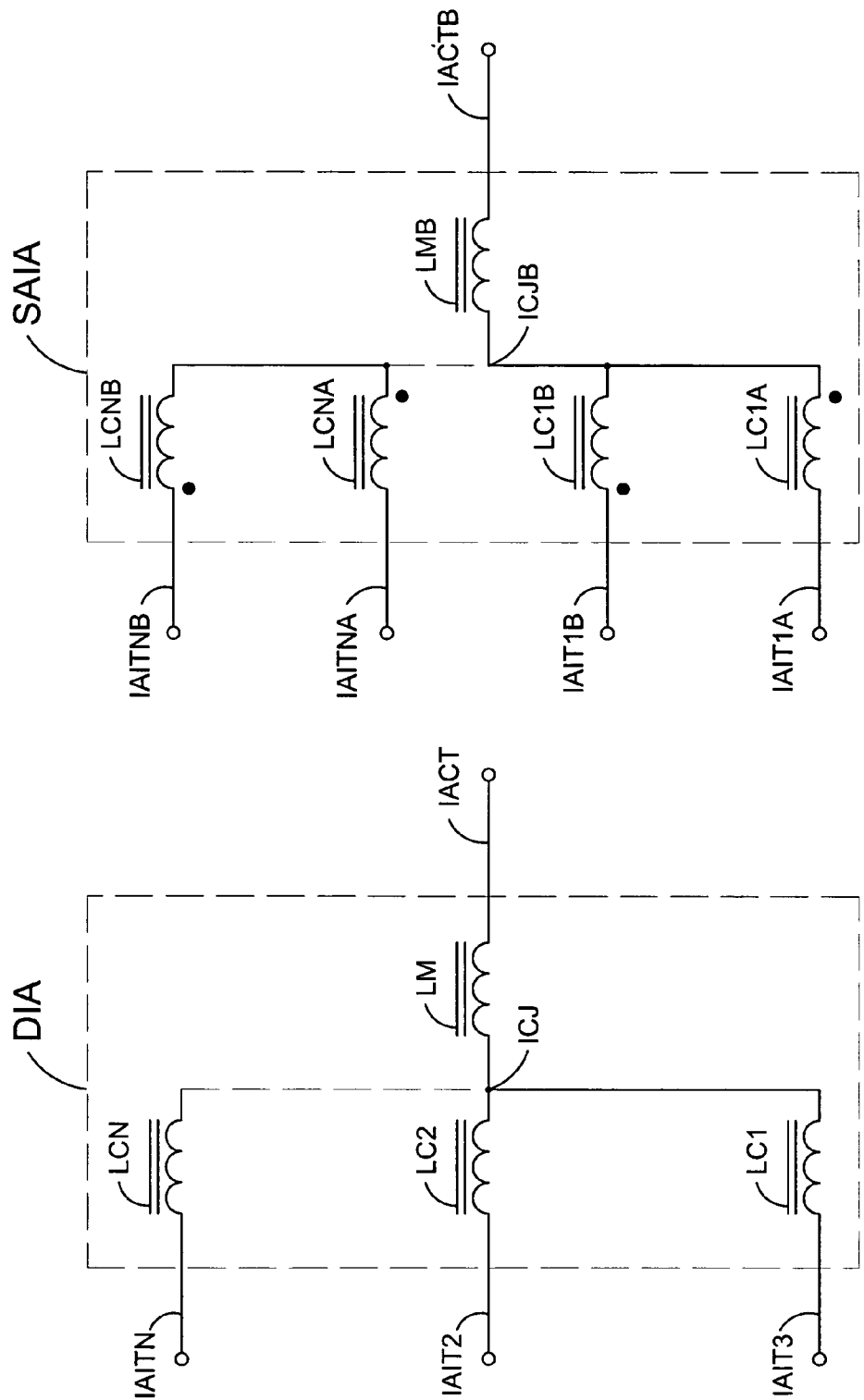
Figure 9:
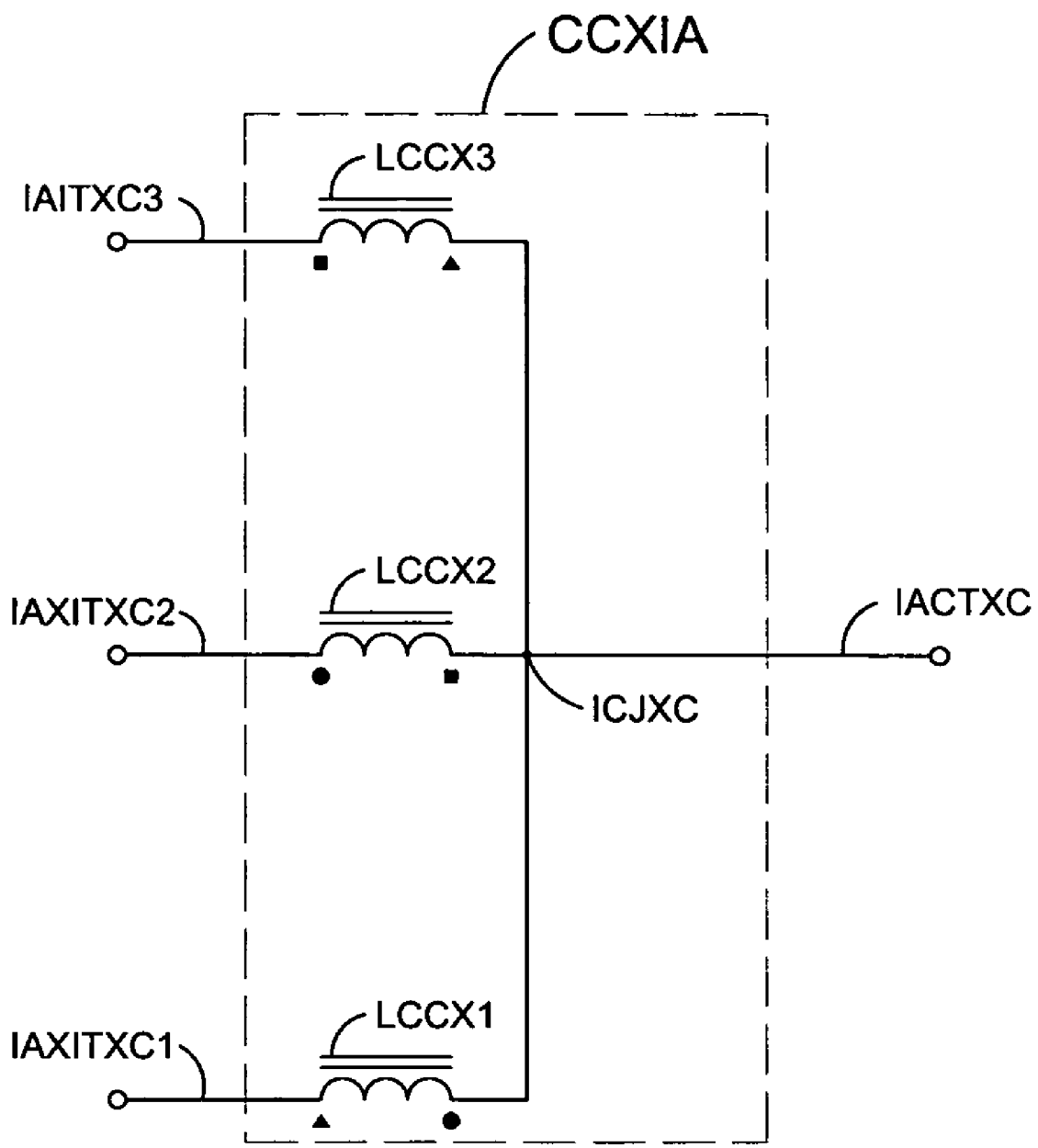

FIG. 3 shows an inductor assembly implementation DIA in which one of N discrete commutation inductors LC1 . . . LCN is connected between each inductor assembly input terminal IAIT1 . . . IAITN and an inductor common junction ICJ. A main converter inductor LM is connected between junction ICJ and the inductor assembly common terminal IACT. In order to prevent excessively long commutation times, the inductance between inductor assembly input terminals IAIT1 and IAIT2 is preferably less than about one-fifth of the inductance of between each of these terminals and the inductor assembly common terminal IACT. The inductance of the commutation inductors in FIG. 9 is therefore preferably less than one-ninth of the inductance of the main inductor LM.

FIG. 4 shows an inductor assembly SAIA that has N pairs of commutation inductors connected in a series-aiding coupling arrangement. One inductor is connected between each inductor assembly input terminal IAIT1A . . . IAITNA, IAIT1B . . . IAITNB and an inductor common junction ICJB. When more than two windings are used in this type of inductor assembly they must come in pairs, and the switching sequence must be ordered so that every successive switching assembly in the sequence is connected to a winding of opposite polarity. The two simplest ways of implementing the coupled commutation inductors LC1A-LC1B . . . LCNA-LCNB are to wrap the windings around the center leg of an E-core set, or to wrap them around the same side of a C-core set. Each pair of commutation inductor windings is preferably tightly coupled (coupling coefficient of at least 0.9). The inductances of the commutation inductor windings are preferably nearly equal. The inductance between a pair of inductor assembly input terminals approaches four times the inductance of one winding for tightly coupled windings that are connected in a series-aiding arrangement. A main converter inductor LMB is connected between an inductor assembly common terminal IACTB and the common connection between each pair of windings at an inductor common junction ICJB.

The peak energy stored in each of the commutation inductors LC1 . . . LCN of FIG. 3 is slightly less than the total peak energy stored in each pair of the coupled commutation inductors IC1A-IC1B . . . ICNA-ICNB of FIG. 4 when the inductances between their corresponding input terminals are the same, the operating conditions are the same, and the peak reverse-recovery currents of the diodes are minimal in comparison to diode forward currents. Thus, the size of the coupled commutation inductors of FIG. 4 can be significantly smaller than the combined size an equal number of the discrete commutation inductors of FIG. 3. For equivalent inductor assemblies and equivalent operating conditions, there will be slightly more peak energy stored in the main inductor LM of FIG. 3 in comparison with the corresponding main inductor LMB of FIG. 4 because the total peak energy storage for the two configurations must be equal. This minor increased energy storage requirement for LM, however, has a negligible effect on its physical size.

FIG. 5 shows an inductor assembly implementation CCIA that has three coupled commutation inductors LLC1 . . . LLC3 that are intended to be driven by three switching assemblies. The commutation inductors could be implemented with three windings wound around three legs of a core similar to what is used in three-phase transformers. The magnitude of the coupling between each winding pair must be less than 0.5, so the relative size reduction possible with this configuration in comparison with three discrete inductors of FIG. 3 will generally be less than the relative size reduction possible for two tightly coupled windings of FIG. 4 in comparison with two discrete inductors of FIG. 3. One commutation inductor is connected to between each inductor assembly input terminal IAICT1 . . . IAICT3 and junction ICJC. A main inductor LMC is connected between junction ICJC and the inductor assembly common terminal IACTC.

FIG. 6 shows an inductor assembly SOIA in which two main inductor windings LMD1 and LMD2 are wound on a common core structure with a series-opposing coupling arrangement. There are no commutation inductors, but the diode commutation effect still occurs due to the leakage inductance between the two windings. The inductances between inductor assembly input terminals IAITD1 and IAITD2 and inductor assembly common terminal IACTD are preferably equal, and the inductance between the inductor assembly input terminals is preferably less than one fifth of the inductance between an input terminal and the common terminal IACT. These constraints imply that the coupling coefficient is at least 0.9. The copper utilization for the inductance assemblies of FIG. 6 is not as good as for those of FIGS. 3-5 because the currents in the main windings are discontinuous. The configuration shown in FIG. 4 with one pair of windings is the preferred embodiment of the inductor assembly.

Figures 7, 8:
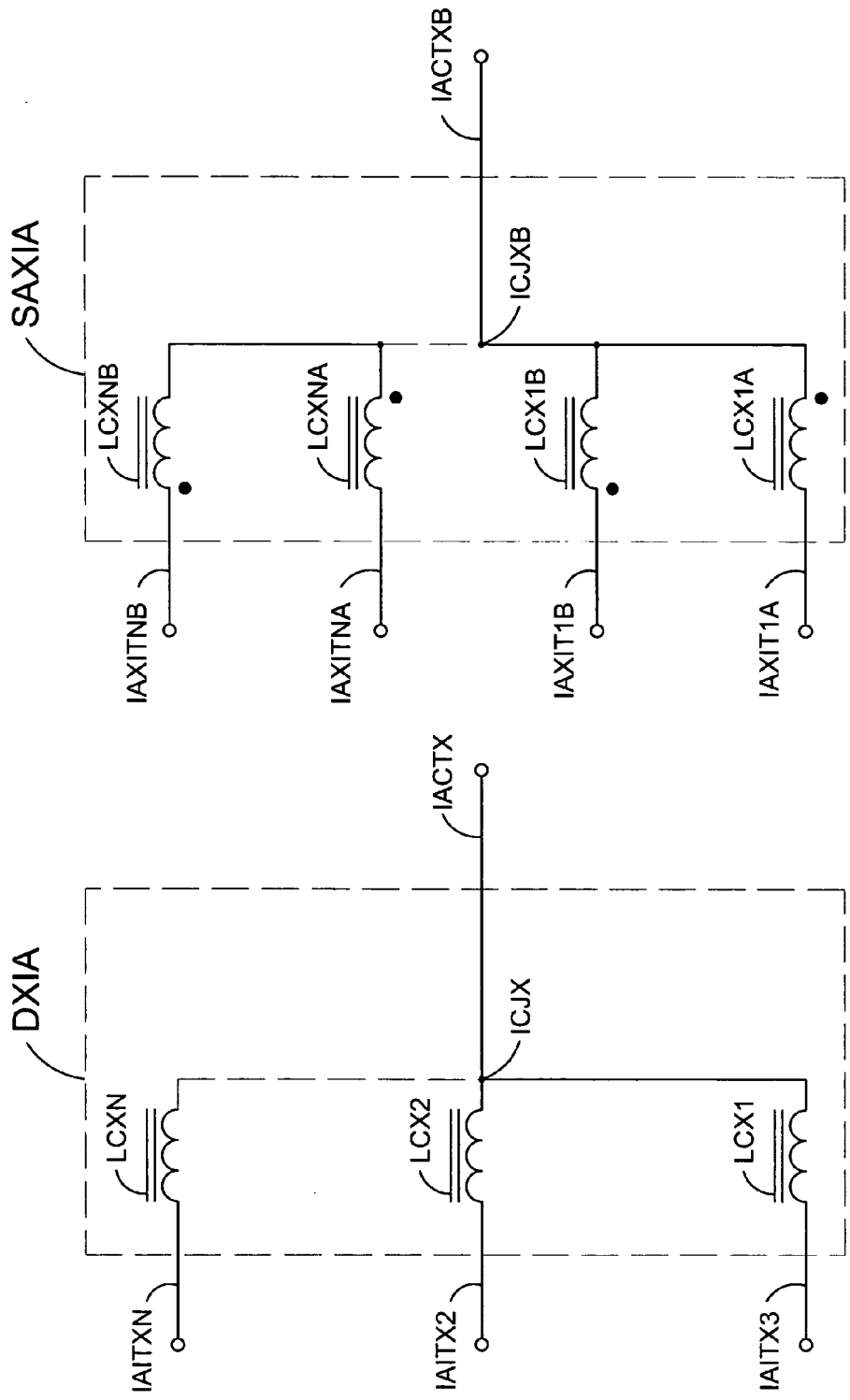
FIGS. 7-9 illustrate details of various embodiments of the inductor assembly IA of FIG. 2 that provide unfiltered output current.

FIGS. 7-9 show alternative implementations of inductor assembly IA of FIG. 2 when filtering of the current flowing in the active pole terminal is not required. FIGS. 7-9 show inductor assembly implementations DXIA, SAXIA and CCXIA that are similar, respectively, to inductor assembly implementation DIA, SAIA and XXIA except that the main converter inductors LM, LMB and LMC are not present. As with the inductor assemblies of FIGS. 3-6, the inductances between pairs of inductor assembly input terminals that are connected to a pair of consecutively operated switching pole circuits, $L_{ii}$, is an important parameter in producing soft switching operation. The inductance between an inductor assembly input terminal and the inductor assembly common terminal IACT, $L_{ic}$, is not intended to provide filtering. The $L_{ii}$ inductance values are significantly greater than the $L_{ic}$ inductance values.

While the previously described preferred values of the ratios between inductance values in the various implementations of inductor assembly IA are derived from typical diode commutation times and typical ripple current levels in the main inductors, they are merely guidelines for illustration, and not primary design constraints.

Figure 10:
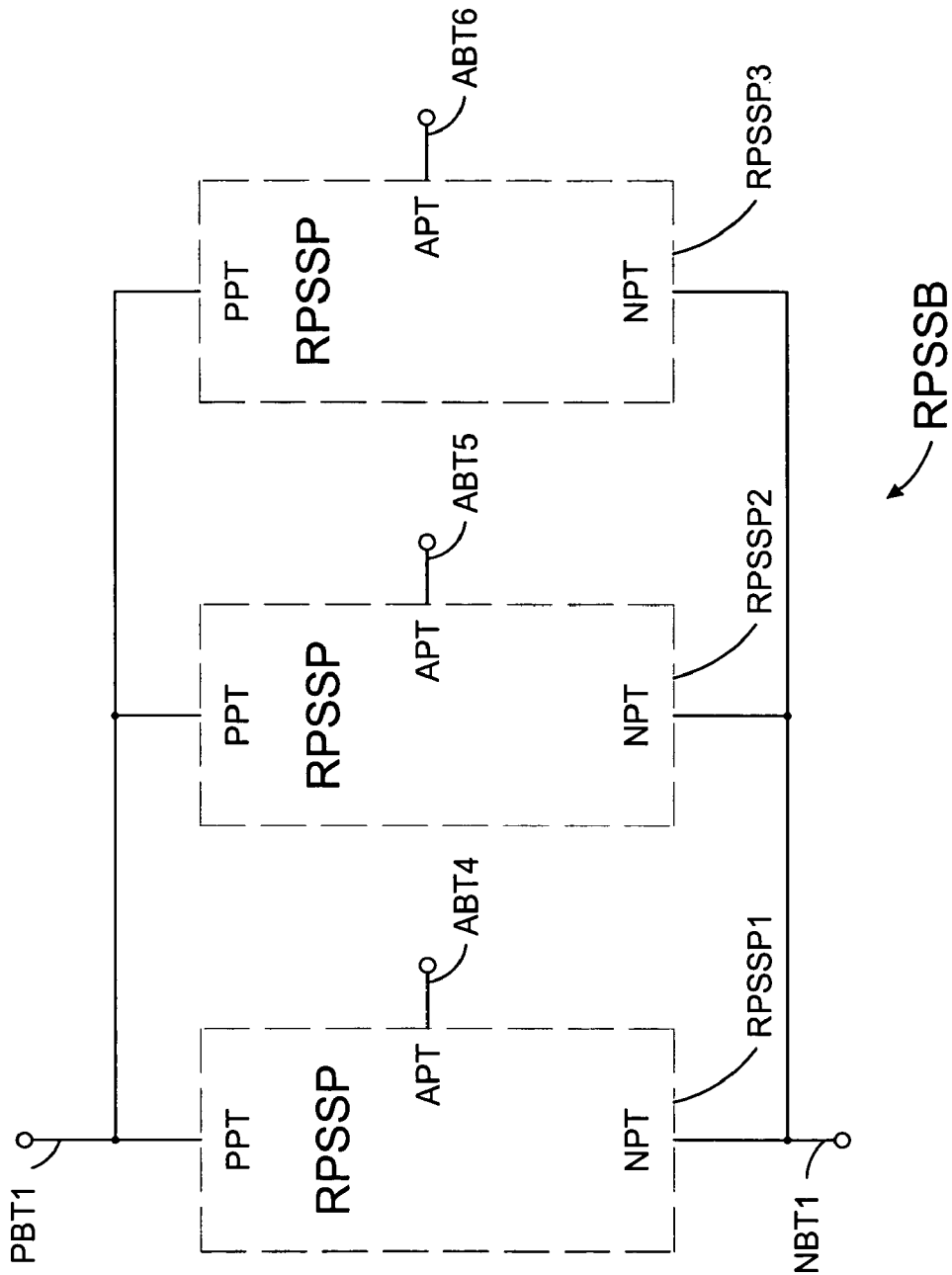
FIG. 10 illustrates a repetitive-polarity interleaved soft switching bridge power converter in accordance with one embodiment of the invention.

FIG. 10 shows a repetitive-polarity soft-switching bridge power converter RPSSB in accordance with a further embodiment of the invention. This type of converter is used in applications such as active rectifiers and motor drives where the output polarity of the current flowing in the active bridge terminals changes at a rate that is much slower than the switching frequency. A repetitive-polarity soft-switching bridge power converter RPSSB comprises at least one repetitive-polarity soft-switching pole circuit. FIG. 10 shows a three-phase converter with soft-switching pole circuits RPSSP1-RPSSP3. The positive pole terminal PPT of each switching pole is connected to a positive bridge terminal PBT1, and the negative pole terminals NPT of each switching pole is connected to a negative bridge terminal NBT1. In one embodiment of the invention, the SPA switches connected between the positive pole terminal and an active pole terminal (SPA position switches) in each repetitive polarity soft switching pole operate in an alternating manner for a first time interval and then the switches connected between the negative pole terminal and an active pole terminal (SNA position switches) operate in an alternating manner for a second time interval. In another embodiment of the invention, the SPA switches and SNA switches in each simple switching pole are alternatively switched on and off, and the switches of corresponding positions (i.e. SPA or SNA) in different simple switching poles are switched in an interleaved switching pattern.

The active pole terminal APT of each soft-switching pole circuit is connected to an active bridge terminal ABT. The switching patterns are adjusted so as to regulate power flowing between active bridge terminals ABT4-ABT6. A full-bridge converter requires two soft-switching pole circuits, and a half-bridge converter has only one soft-switching pole circuit. The inductor assemblies of FIGS. 7-9 can be used in applications such as motor drives where the inductances of the motor are used to smooth the currents.

Figure 11:
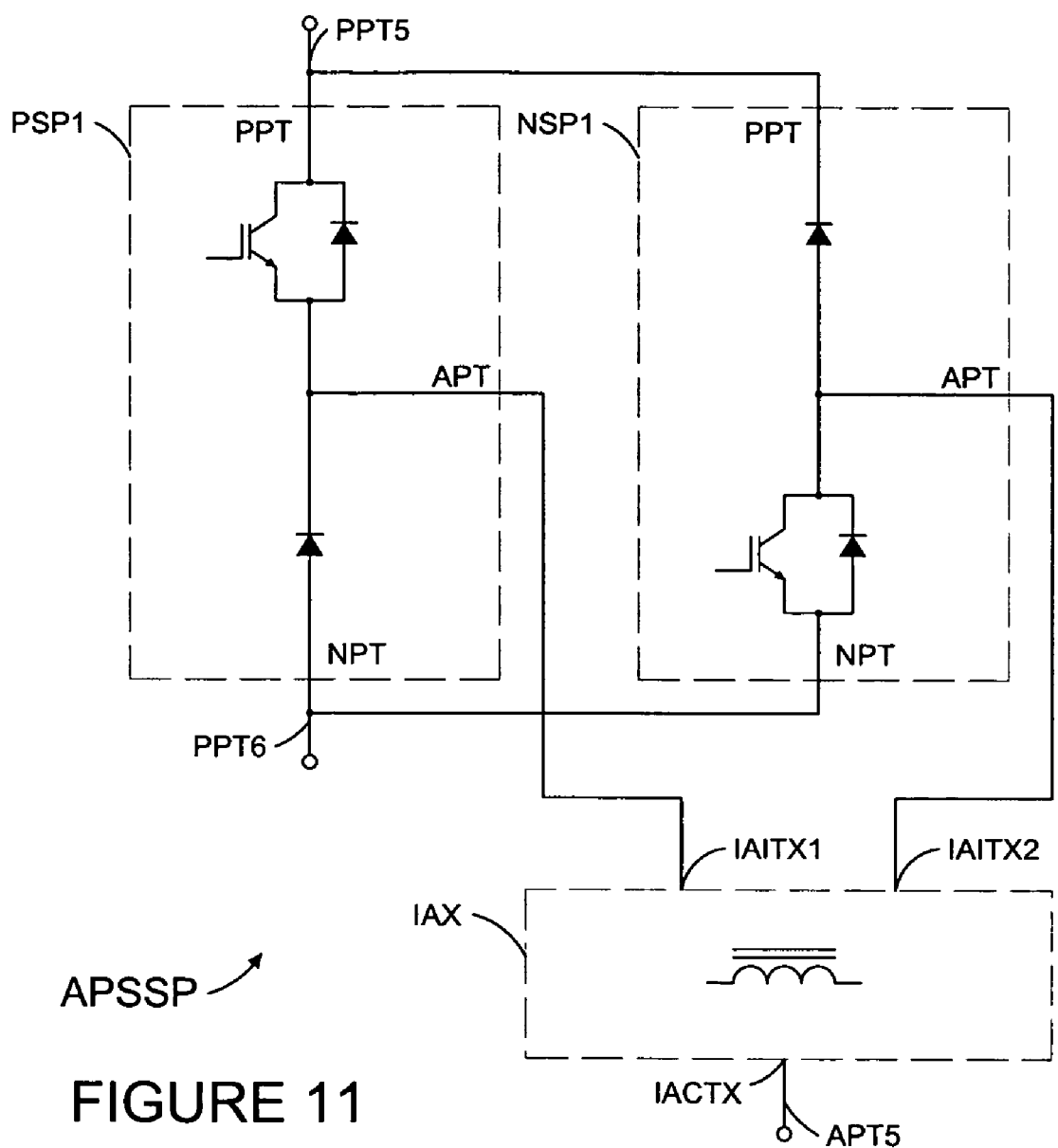
FIG. 11 illustrates an alternating-polarity interleaved soft switching pole circuit in accordance with a further embodiment of the invention.

FIG. 11 shows an alternating-polarity soft interleaved soft switching pole circuit APSSP in accordance with an embodiment of the invention. An alternating-polarity interleaved soft-switching pole circuit is a composite pole circuit that includes a positive switching pole circuit such as PSP1 and a negative switching pole circuit such as NSP1. Positive switching pole circuits have an active switch in the SPA position and a passive switch in the SNA position. Negative switching pole circuits have an active switch in the SNA position and a passive switch in the SPA position. The positive pole terminal PPT of each switching pole is connected to a positive pole terminal PPT5, and the negative pole terminals NPT of each switching pole is connected to a negative pole terminal NPT5. The active pole terminal APT of each switching pole circuit is connected to an inductor assembly, IAX, at an inductive assembly input terminal, IAITX1 . . . IAITXN. An inductor assembly common terminal IACTX is connected to the active pole terminal APT5 of soft interleaved soft switching pole circuit APSSP. Inductor assembly IAX can be realized with the inductor assemblies of FIGS. 6-9.

Figure 12:
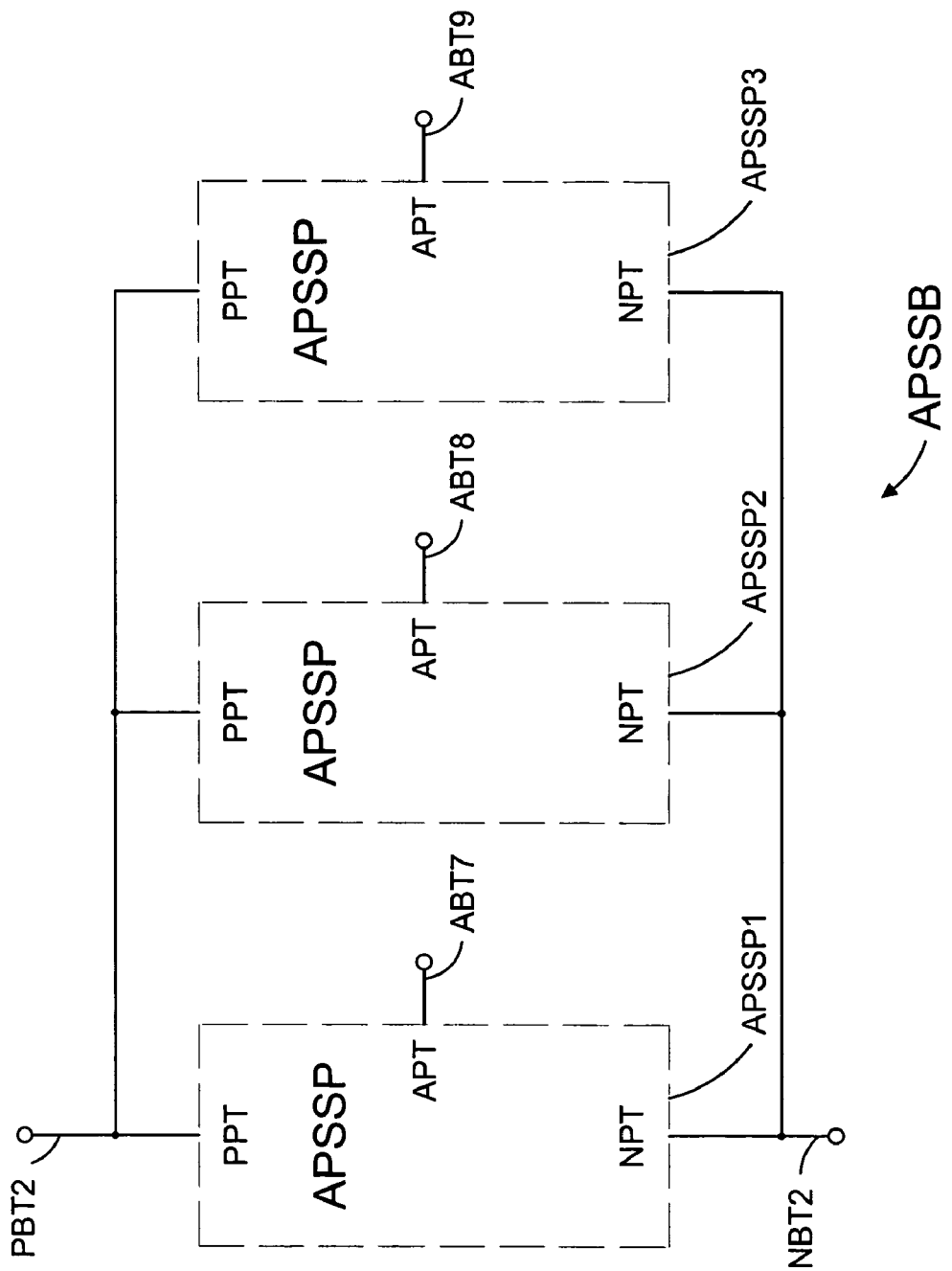
FIG. 12 illustrates an alternating-polarity interleaved soft switching bridge power converter in accordance with an embodiment of the invention.

FIG. 12 shows an alternating-polarity soft-switching bridge power converter APSSB in accordance with an embodiment of the invention. This type of converter is used in high-frequency inverter applications in which the output polarity of the current flowing in the active bridge terminals changes at a rate that is equal to the switching frequency. An alternating-polarity soft-switching bridge power converter APSSB comprises at least one alternating-polarity soft-switching pole circuit. FIG. 12 shows a three-phase converter with soft-switching pole circuits APSSP1-APSSP3. The positive pole terminal PPT of each switching pole is connected to a positive bridge terminal PBT2, and the negative pole terminals NPT of each switching pole is connected to a negative bridge terminal NBT2. The SPA and SNA switches in each alternating-polarity soft-switching pole circuit operate in an alternating manner. The active pole terminal APT of each soft-switching pole circuit is connected to an active bridge terminal ABT. The switching patterns are adjusted so as to regulate power flowing between active bridge terminals ABT7-ABT9. Power regulation can be accomplished by of known methods such as symmetrical and asymmetrical pulse-width modulation; adjusting the phase angle between the voltages at active bridge terminals, and varying the switching frequency. A full-bridge converter requires two soft-switching pole circuits, and a half-bridge converter has only one soft-switching pole circuit.

Figure 13:
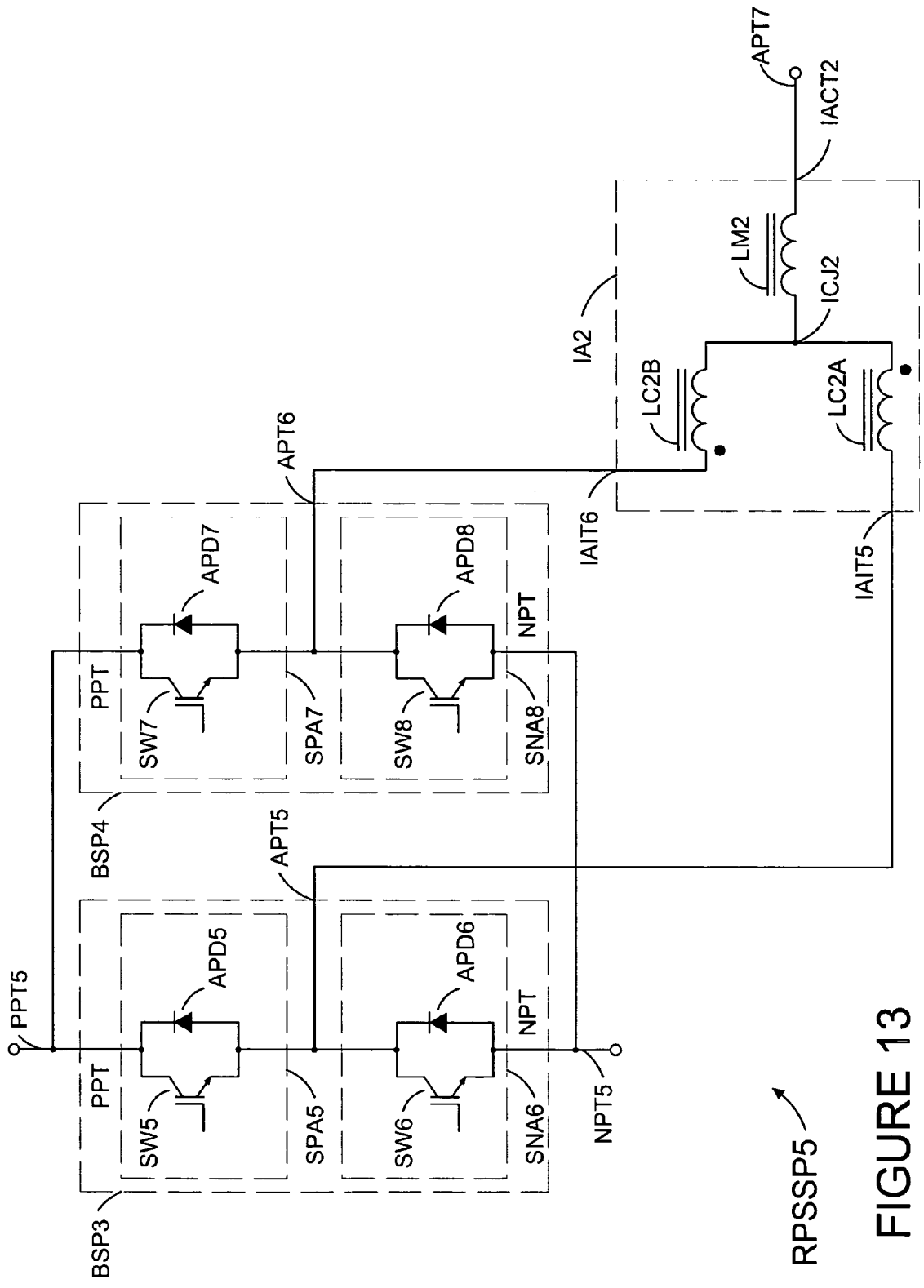
FIG. 13 illustrates a specific implementation of the repetitive-polarity interleaved soft switching pole circuit of FIG. 1 in accordance with a further embodiment of the invention.
Figure 14:
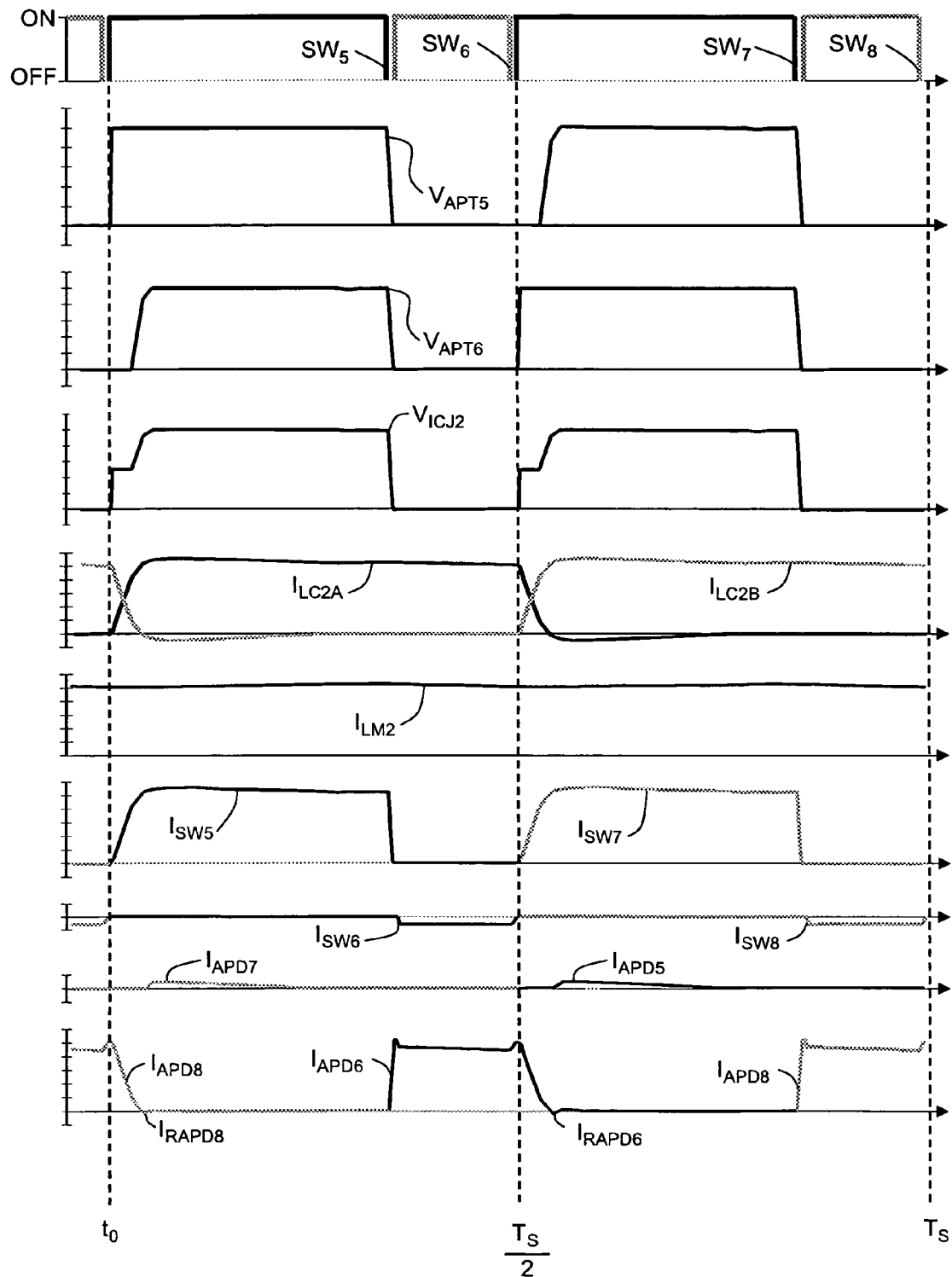
FIG. 14 illustrates waveforms of the repetitive-polarity interleaved soft switching pole circuit of FIG. 13.

FIG. 13 illustrates a specific implementation RPSSP5 of the repetitive-polarity interleaved soft switching pole circuit of FIG. 2 that uses the series-aiding coupling arrangement shown in FIG. 4 for inductor assembly IA2. FIG. 14 shows waveforms from operation of the circuit depicted in FIG. 13. The voltage between active pole terminal APT5 and negative pole terminal NPT5 is labeled as $V_{APT5}$, and the voltage between active pole terminal APT6 and negative pole terminal NPT5 is labeled as $V_{APT6}$. The voltage between inductor common junction ICJ2 and negative pole terminal NPT5 is labeled as $V_{ICJ2}$. The currents flowing from the commutation inductors into ICJ2 are labeled as $I_{LC2A}$ and $I_{LC2B}$. The current flowing out of ICJ2 into inductor LM2 into is labeled as $I_{LM2}$. The waveforms of FIG. 14 illustrates operation of the circuit of FIG. 13 for one switching period starting at time $t_0$, and ending at time $T_s$, for an operating regime in which the active switching devices (SW5 and SW7) in the SPA switches (SPA5 and SPA7) are controlling the current flowing out of active pole terminal APT7, and the active switching devices (SW6 and SW8) in the SNA switches (SNA6 and SNA8) are operating at essentially the same time as the corresponding anti-parallel diodes (APD6 and APD8), which carry most of the current and function as free-wheeling diodes.

Referring to FIG. 14, switching device SW5 is turned on at time $t_0$. The current through anti-parallel diode APD6, $I_{APD6}$, is typically very small or possibly zero at this time, so the peak reverse-recovery current $I_{RAPD6}$ of APD6 is also very small or possibly zero. At time $t_0$, the current through diode APD8, $I_{APD8}$, is equal to the current through LC2B. After SW5 turns on, the current through it ramps up as the current in diode APD8 ramps down toward zero. The slope of the current transition in amperes/second is equal to the voltage between the positive and negative pole terminals divided by the commutation inductance, $L_{ii}$. The value of $L_{ii}$ should be selected to be large enough to allow the reverse-recovery currents in the anti-parallel diodes to be much smaller than the peak values of the forward operating currents.

When SW5 turns off, the voltage at APT5 rings down immediately, and APD6 begins to conduct, picking up the main inductor current $I_{LM2}$. Depending on the operating conditions, there may be a small current flowing in LC2B when SW5 turns off. If there is current flowing in LC2B at that time, IAPD7 turns off with a small reverse-recovery current shortly after SW5 turns off, and the voltage at APT6 rings down until APD8 begins to conduct. Switch SW7 turns on at time $T_s/2$, and because there is little, if any, current flowing through diode APD8 at that time, SW7 turns on without a large current spike, just as SW5 did at time $t_0$. The current through commutation inductor LC2A reverses as APD6 is being turned off, and when APD6 finally turns off, this current causes the voltage at APT5 to ring up until anti-parallel diode APD5 conducts. When SW7 turns off, the voltage at APT6 rings down immediately, and APD8 begins to conduct, picking up the main inductor current $I_{LM2}$. Depending on the operating conditions, there may be a small current flowing in LC2A when SW7 turns off. If there is current flowing in LC2A at that time, LAPD5 turns off with a small reverse-recovery current shortly after SW7 turns off, and the voltage at APT5 rings down until APD6 begins to conduct.

The magnitude and direction of the current flowing through active pole terminal APT5 is controlled by adjusting the duty cycles of SPA switches SW5 and SW7 with respect to the duty cycles of SNA switches SW6 and SW8. Soft-switching pole circuit RPSSP5 can process power bi-directionally, and is therefore useful as both an inverter and a rectifier. In alternative embodiments of the invention, RPSSP5 is used as a class D power amplifier.

The voltage at the active pole terminal with respect to the positive and negative pole terminals is affected by the current flowing in the active terminal in addition to being affected by the duty cycle of the switches because of the effect of the commutation inductors. The average value of the voltage drop due to the commutation inductors is approximately equal to the average value of the current flowing out of active pole terminal times the inductance between the inductor assembly input terminals, $L_{ii}$, divided by the switching period $T_s$. This effect increases the impedance at active pole terminal APT5 of soft-switching pole circuit RPSSP5. If the commutation inductance is sufficiently large, this impedance will allow soft-switching pole circuits to be connected in parallel without having to be concerned about current sharing issues due to component tolerances.

In addition to the switching pattern shown in FIG. 14, during time intervals when it is known that the current flowing out of APT5 will be positive, it is possible to operate the SPA switches, SW5 and SW7, in the same interleaved manner shown in FIG. 14 while not switching the SNA switches, SW6 and SW8. Similarly, the SNA switches SW6 and SW8 can be operated in an interleaved manner while leaving the SPA switches SW5 and SW7 off during time intervals when it is known that current will be flowing into APT5. In many cases, it may be difficult to predict exactly when the operating mode should be changed from switching the SPA switches to switching the SNA switches or vice-versa. The switching pattern of FIG. 14 avoids this difficulty.

Although specific structure and details of operation are illustrated and described herein, it is to be understood that these descriptions are exemplary and that alternative embodiments and equivalents may be readily made by those skilled in the art without departing from the spirit and the scope of this invention. Accordingly, the invention is intended to embrace all such alternatives and equivalents that fall within the spirit and scope of the appended claims.

What is claimed is:

1. A method of delivering power to a load comprising:
   a) providing a switching circuit comprising a first switching pole circuit disposed across positive and negative voltages supplied by a voltage supply and a second switching pole circuit disposed across positive and negative voltages supplied by the voltage supply;
   b) operating at least one switch of the first switching pole circuit so as to deliver a current from the first switching pole circuit to a load; and
   c) operating at least one switch of the second switching pole circuit so as to further deliver current from the second switching pole circuit to the load, the operation of the at least one switch of the second switching pole circuit interleaved with the operation of the at least one switch of the first switching pole circuit so as to substantially reduce a diode reverse recovery current in the first switching pole circuit.

2. The method of claim 1, further comprising operating at least one switch of the first switching pole circuit so as to further deliver current from the switching circuit to a load, the operation of the at least one switch of the first switching pole circuit interleaved with the operation of the at least one switch of the second switching pole circuit so as to substantially reduce a diode reverse recovery current in the second switching pole circuit.

3. The method of claim 1 wherein the operation of the at least one switch of the second switching pole circuit is interleaved with the operation of the at least one switch of the first switching pole circuit so as to provide a controlled current slope that recovers a diode of the first switching pole circuit with substantially reduced diode reverse recovery losses.

4. The method of claim 3 wherein the current slope is controlled by at least one inductor disposed in a current path between the first switching pole circuit and the second switching pole circuit.

5. The method of claim 1 wherein the first and second switching pole circuits are disposed in a full bridge topology.

6. The method of claim 1 wherein the first and second switching pole circuits are disposed as one leg of a multiphase power converter.

7. The method of claim 1, further comprising regulating the operation of the first and second switching pole circuits so as to provide a direct current output to the load.

8. The method of claim 1, further comprising regulating the operation of the first and second switching pole circuits so as to provide an alternating current output to the load.

9. A power converter comprising:
   a) a first switching pole circuit disposed across positive and negative voltages supplied by a voltage supply and a second switching pole circuit disposed across positive and negative voltages supplied by the voltage supply;
   b) at least one inductor disposed in a current path between the first switching pole circuit and the second switching pole circuit; and
   c) control circuitry for operating at least one switch of the first switching pole circuit so as to deliver a current from the first switching pole circuit to a load and for operating at least one switch of the second switching pole circuit so as to further deliver current from the second switching pole circuit to the load, the control circuitry interleaving the operation of the at least one switch of the second switching pole circuit with the operation of the at least one switch of the first switching pole circuit so as to substantially reduce a diode reverse recovery current in the first switching pole circuit.

10. The power converter of claim 9 wherein the control circuitry interleaves the operation of the at least one switch of the first switching pole circuit with the operation of the at least one switch of the second switching pole circuit so as to substantially reduce a diode reverse recovery current in the second switching pole circuit.

11. The power converter of claim 9 wherein the at least one inductor is disposed to provide a controlled current slope that recovers a diode of the first switching pole circuit with substantially reduced diode reverse recovery losses.

12. The power converter of claim 9 wherein the first and second switching pole circuits are disposed in a full bridge topology.

13. The power converter of claim 9 wherein the control circuitry operates to provide a direct current output to the load.

14. The power converter of claim 9 wherein the control circuitry operates to provide an alternating current output to the load.

15. A multiphase power converter comprising a plurality of converter legs, at least one of the converter legs comprising:
   a) a first switching pole circuit disposed across positive and negative voltages supplied by a voltage supply and a second switching pole circuit disposed across positive and negative voltages supplied by the voltage supply;
   b) at least one inductor disposed in a current path between the first switching pole circuit and the second switching pole circuit; and
   c) control circuitry for operating at least one switch of the first switching pole circuit so as to deliver a current from the first switching pole circuit to a load and for operating at least one switch of the second switching pole circuit so as to further deliver current from the second switching pole circuit to a load, the control circuitry interleaving the operation of the at least one switch of the second switching pole circuit with the operation of the at least one switch of the first switching pole circuit so as to substantially reduce a diode reverse recovery current in the first switching pole circuit.

* * * * *